United States Patent [19]

Coe et al.

[11] Patent Number: 5,128,730
[45] Date of Patent: Jul. 7, 1992

[54] SEMICONDUCTOR DEVICE AND A CIRCUIT SUITABLE FOR USE IN AN INTELLIGENT POWER SWITCH

[75] Inventors: David J. Coe, East Grinstead; David H. Paxman, Redhill, both of England; Franciscus A. C. M. Schoofs, Valkenswaard, Netherlands

[73] Assignee: U.S. Philips Corp., New York, N.Y.

[21] Appl. No.: 727,317

[22] Filed: Jul. 2, 1991

Related U.S. Application Data

[63] Continuation of Ser. No. 643,694, Jan. 22, 1991, abandoned, which is a continuation of Ser. No. 203,406, Jun. 6, 1988, abandoned.

Foreign Application Priority Data

Jun. 8, 1987 [GB] United Kingdom ............. 8713388

[51] Int. Cl.$^5$ .............. H01L 29/10; H01L 29/90; H01L 29/68
[52] U.S. Cl. .................. 357/23.4; 357/13; 357/23.8
[58] Field of Search ........... 357/13, 20, 23.4, 23.8, 357/23.12

[56] References Cited

U.S. PATENT DOCUMENTS

| | | | |
|---|---|---|---|
| 3,893,151 | 7/1975 | Bosselaar et al. | 357/13 |
| 4,626,879 | 12/1986 | Colak | 357/13 |
| 4,862,233 | 8/1989 | Matsushita et al. | 357/13 |

Primary Examiner—Andrew J. James
Assistant Examiner—Ngan Van Ngo
Attorney, Agent, or Firm—Steven R. Biren

[57] ABSTRACT

A semiconductor device and a circuit suitable for use in an intelligent power switch include an insulated gate field effect transistor (IGFET) (T2) and a power semiconductor switch (T1). The insulated gate field transistor IGFET (T2) is provided by a semiconductor body (6) which has a first region (7) of one conductivity type adjacent a given surface (6a) of the semiconductor body with the first region (7) forming at least part of a conductive path to a first main electrode of the power semiconductor switch. A second region (8) of the opposite conductivity type is provided within the first region adjacent the given surface (6a) and a third region (11) of the one conductivity type is provided adjacent the given surface (6a) within the second region (8), an area of the second region (8) underlying an insulated gate (14) provided on the given surface (6a) for defining a conduction channel (15) providing a gateable connection between the third region (11) and a fourth region (12) of the one conductivity type. The third and fourth regions (11 and 12) forming the source and drain regions of the IGFET and the second and third regions (8 and 11) together provide a zener diode, a conductive path being provided to the second region remote from the area underlying the insulated gate for reverse-biassing the zener diode. The IGFET may include a synchronous rectifier of a charge pump for providing a gate voltage signal to the power semiconductor switch which may be a power MOSFET (T2).

11 Claims, 2 Drawing Sheets

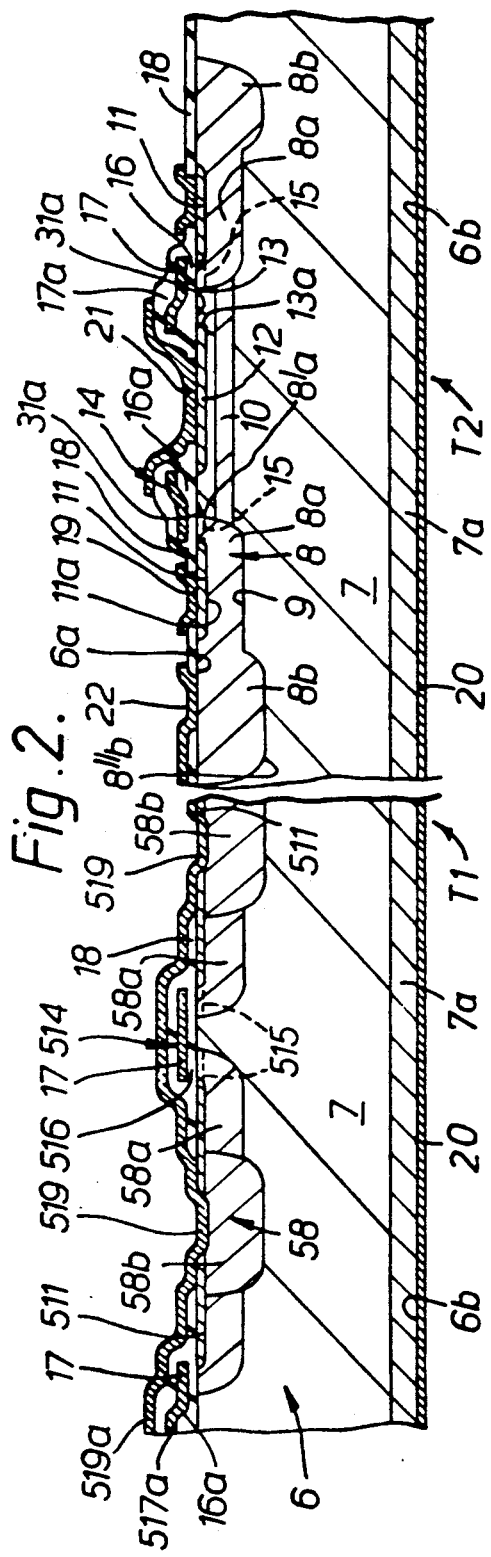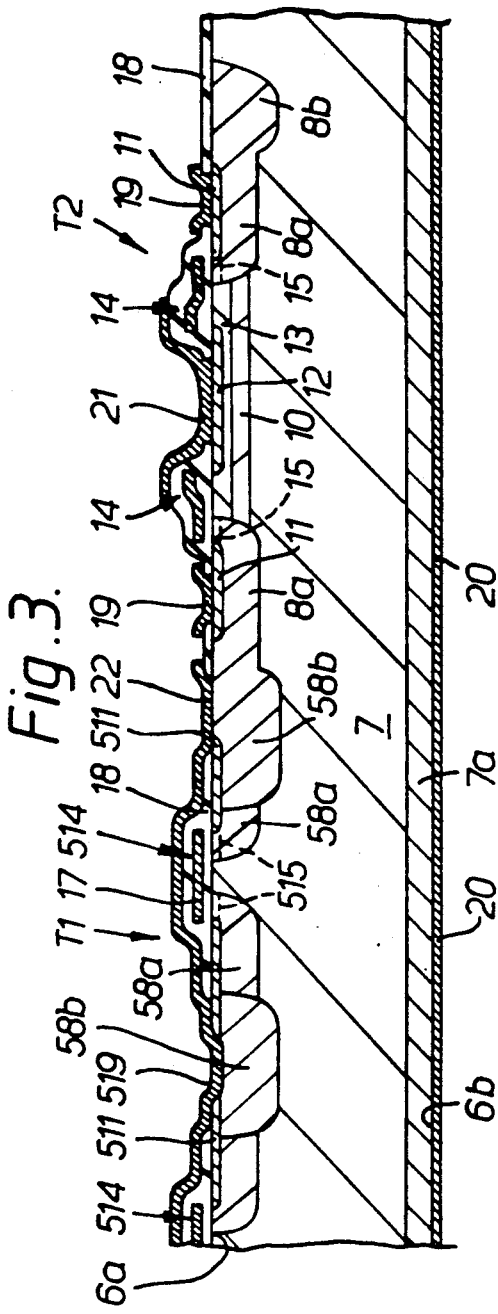

SEMICONDUCTOR DEVICE AND A CIRCUIT SUITABLE FOR USE IN AN INTELLIGENT POWER SWITCH

This is a continuation of application Ser. No. 643,694, filed Jan. 22, 1991 which is a continuation of Ser. No. 203,406 filed Jun. 6, 1988 both now abandoned.

BACKGROUND OF THE INVENTION

This invention relates to a semiconductor device and a circuit suitable for use in an intelligent power switch.

As used herein the term 'intelligent power switch' is to be understood as meaning a semiconductor device in which one or more power semiconductor components are provided in or on the same semiconductor body as logic components for controlling and monitoring operation of the power semiconductor component and a load in circuit with the switch.

An intelligent power switch is described in a paper entitled: 'SMART-SIPMOS—an intelligent power switch' by M. Glogolja and Dr. J. Tihanyi published in the Conference Record of the 1986 IEEE Industry Applications Society Annual Meeting Part I at pages 429 to 433.

As described in the aforementioned paper, the intelligent power switch comprises a power MOSFET and high and low voltage CMOS circuitry providing control functions for the power MOSFET. The intelligent power switch described in the paper is intended to be used as a high side switch and so to be connected between a positive power supply terminal, for example the positive terminal of a battery in automotive applications, and the load. In such circumstances, in order to turn the power MOSFET on, a gate voltage for the power MOSFET higher than the battery voltage needs to be generated. In the arrangement described in the paper, the gate voltage is generated using a drive circuit which consists of a charge pump, rectifier and level shifter. Thus, during a first half of the alternating cycle of an oscillator a capacitor C1 of the charge pump shown in FIG. 3 of the aforementioned paper is charged to almost the full battery voltage via IGFET Q4, diode D5 and IGFET Q7. During the second half of the cycle, the left hand side plate of the capacitor C1 is switched by IGFET Q3 to the battery positive terminal potential so that the charge from C1 is transfered via an IGFET Q5 acting as a rectifier to the gate of the power MOSFET and, after a given number of cycles of the oscillator a reasonable gate source voltage is reached to turn on the power MOSFET.

SUMMARY OF THE INVENTION

It is an object of the present invention to provide a semiconductor device and circuit suitable for use in an intelligent power switch, in particular suitable for use in a drive circuit for the power semiconductor switch of the intelligent power switch.

According to a first aspect of the present invention, there is provided a semiconductor device comprising an IGFET and a power semiconductor switch, which semiconductor device comprises a semiconductor body having a first region of one conductivity type adjacent a given surface of the semiconductor body, the first region forming at least part of a conductive path to a first main electrode of the power switch, a second region of the opposite conductivity type provided within the first region adjacent the given surface and so as to form with the first region a first pn junction meeting the given surface and third and fourth regions of the one conductivity type provided adjacent the given surface within the second region so as to each form with the second region a pn junction meeting the given surface, an insulated gate provided on the given surface for defining a conduction channel providing a gateable connection between the third and fourth regions which form the source and drain regions of the IGFET, and a conductive path provided to the second region remote from the insulated gate for reverse biassing a zener diode formed between the second region and the source region of the IGFET so as to inhibit conduction from the second region to the first region.

A semiconductor device embodying the invention may be used as a synchronous rectifier in a charge pump arrangement suitable for use in an intelligent power switch with the conductive path enabling undesired conduction to the first region and therefore to the power semiconductor switch to be inhibited.

The drain region of the IGFET may have an extension region which extends adjacent the given suface towards the third region and is sufficiently lowly doped and sufficiently thin so as to become fully depleted of free charge carriers before the reverse breakdown voltage of the pn junction between the drain region and the second region is reached.

The source and drain regions of the IGFET may lie, respectively, in first and second subsidiary regions of the second region. The second subsidiary region may be sufficiently lowly doped and sufficiently thin to become fully depleted of free charge carriers before the reverse breakdown voltage of the first pn junction is reached. Such an arrangement may enable the IGFET to withstand high reverse voltages which may occur, in for example, use as part of an intelligent power switch incorporated in a motor vehicle.

The power semiconductor switch may comprise a fifth region of the opposite conductivity type adjacent the given surface within the first region, a sixth region of the one conductivity type within the fifth region forming with the fifth region a pn junction meeting a surface of the semiconductor body and a further insulated gate provided on the given surface to define a conduction channel providing a gateable connection between the sixth region and the first region. The fifth region may comprise a first relatively shallow subsidiary region and a relatively deep relatively highly doped further subsidiary region extending through the first relatively shallow subsidiary region of the fifth region, the sixth region lying within the first relatively shallow subsidiary region and separating the further subsidiary region from the further insulated gate.

The subsidiary region of the second region may comprise a relatively shallow region having a relatively deep relatively highly doped further subsidiary region extending through the relatively shallow region, the source region of the IGFET lying within the relatively shallow region and separating the further subsidiary region of the second region from the area of the second region underlying the insulated gate, the conductive path adjoining the further subsidiary region of the second region.

The fifth region may adjoin the first subsidiary region of the second region and the conductive path provided to the second region may comprise a conductive region shorting the sixth region to the fifth region.

Alternatively, the conductive path provided to the second region may comprise a conductive electrode contacting only the second region.

In a second aspect, the present invention provides a circuit for controlling supply of power to a load, which circuit comprises: a first terminal for connection to a power supply; a second terminal for connection via the load to ground; a third terminal for connection to a pulsed voltage source; a power semiconductor switch having a first main electrode connected to the first terminal, a control electrode having an insulated gate, and a second main electrode connected to the second terminal to enable the load to be connected in series with the power switch between the power supply terminal and ground terminal; and an insulated gate field effect transistor (IGFET) having source and drain electrodes, one of the source and drain electrodes being connected to the insulated gate control electrode of the power switch, and having an insulated gate electrode for controlling a conduction channel of the IGFET to provide a gateable connection between the source and drain electrodes of the IGFET, the IGFET having a further electrode for biassing the conduction channel, the further electrode being connected to follow a voltage at the other of the first and second main electrodes of the power switch, and the insulated gate electrode of the IGFET and the other of the source and drain electrodes of the IGFET being connected to the third terminal via supply means for enabling the IGFET to be rendered conducting to supply a gate control voltage signal to the insulated gate of the power switch to render the power switch conducting.

The supply means may comprise charge storage means connected to the third terminal and via rectifying means to the first terminal for enabling the charge storage means to be charged from the power supply under the control of pulses from the pulsed voltage source. The charge storage means may comprise a first capacitor connected between the third terminal and the gate electrode of the IGFET and a second capacitor connected between the third terminal and the other of the source and drain electrodes of the IGFET and the rectifying means may comprise a first rectifier connected between the gate electrode of the IGFET and the first terminal and a second rectifier connected between the other of the source and drain electrodes of the IGFET and the first terminal.

The further electrode of a circuit embodying the invention enables the provision of a reverse-biassed zener diode between the insulated gate control electrode and the other of the main electrodes to protect the insulated gate control electrode. Furthermore, where the power semiconductor device comprises a power MOSFET arranged to operate in the source follower mode, in the start-up condition the source voltage of the power MOSFET will be low so the synchronous rectifier can be quickly started or turned on by a low gate voltage.

The IGFET of the circuit may be of the type described above with reference to the first aspect of the invention as may be the further IGFET.

BRIEF DESCRIPTION OF THE DRAWING

An embodiment of the invention will now be described, by way of example, with reference to the accompanying drawings, in which:

FIG. 2 is a schematic cross-sectional view, part cutaway, of part of a semiconductor device embodying the invention; and FIG. 3 is a schematic cross-sectional view, part cutaway, of a modified version of the semiconductor device shown in FIG. 2.

Figure 1:
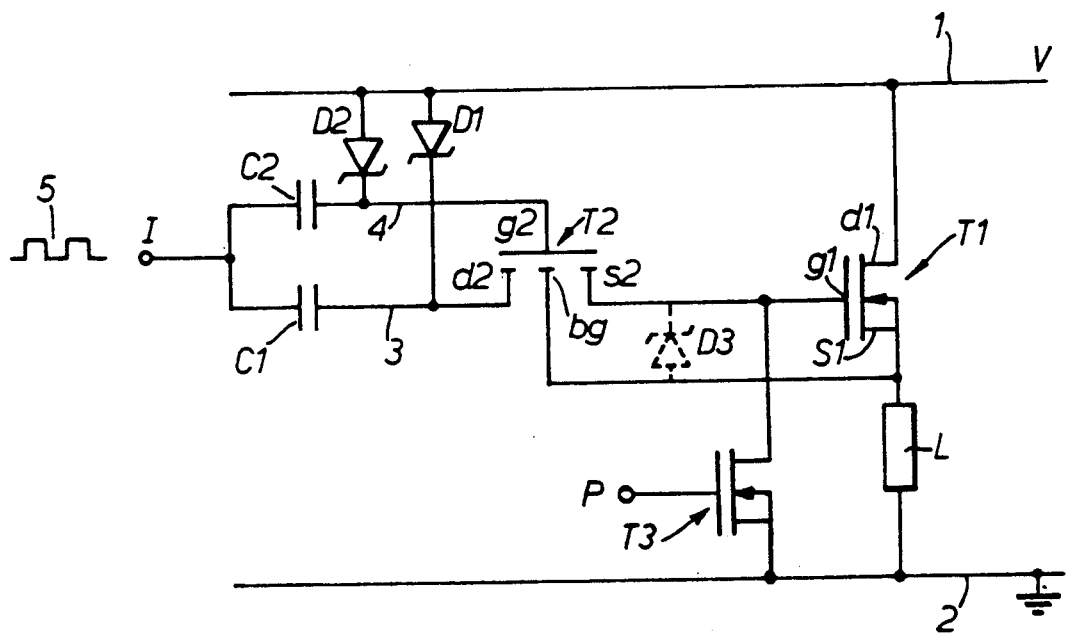
FIG. 1 is a circuit diagram of a circuit embodying the invention for controlling operation of a load.

It should be understood that the Figures are merely schematic and are not drawn to scale. In particular, certain dimensions such as the thickness of layers or regions may have been exaggerated while other dimensions may have been reduced. It should also be understood that the same reference numerals are used throughout the Figures to indicate the same or similar parts.

DESCRIPTION OF THE PREFERRED EMBODIMENTS

Referring now to the drawings, FIG. 1 is a circuit diagram illustrating a circuit embodying the invention for controlling operation of a load.

As shown in FIG. 1, the circuit comprises a power semiconductor switch in the form of a power MOSFET T1 connected in series with a load L between a positive power supply terminal or line 1 and a ground terminal or line 2.

The drain electrode d1 of the power MOSFET T1 is connected to the positive power supply line 1 while source electrode S1 of the power MOSFET T1 is connected to one terminal of the load L, the other terminal of the load being connected to the ground line 2.

The insulated gate electrode g1 of the power MOSFET T1 is connected to one main electrode, in this case the source electrode S2, of an insulated gate field effect transistor (IGFET) T2 which as will be described hereinafter functions as a synchronous rectifier. The other main electrode, in this case the drain electrode d2, of the IGFET T2 is connected via a line 3 to one plate of a first capacitor C1 while the insulated gate electrode g2 of the IGFET T2 is connected via a line 4 to one plate of a second capacitor C2. The cathode of a first breakdown or zener diode D1 is connected to the line 3 and the anode to the positive supply terminal or line 1. Similarly the cathode of a second breakdown or zener diode D2 is connected to the line 4 and the anode to the positive supply terminal 1.

The IGFET T2 has a further electrode bg for biassing the conduction channel underlying the insulated gate of the insulated gate electrode g2. The further electrode thus provides a connection to the 'back gate' of the IGFET T2 providing an integral reverse-biassed breakdown or zener diode between the source and further electrodes S2 and bg of the IGFET T2. This integral zener diode D3 is illustrated in phantom lines in FIG. 1 for the purposes of explaining the operation of the circuit. The further electrode bg is connected to the source electrode S1 of the power MOSFET T1 so that the integral breakdown or zener diode D3 protects the insulated gate electrode g1 of the power MOSFET T1 by regulating the voltage between the source and insulated gate electrodes S1 and g1 of the power MOSFET T1.

The other plates of the capacitors C1 and C2 are connected to an input connection I to which a voltage signal is to be supplied for charging the capacitors C1 and C2. The charging voltage signal may be derived from a voltage supply connected across the lines 1 and 2 by means for charging the capacitors C1 and C2 in the form of a ring oscillator circuit (not shown) of conventional design which supplies to the input connection an oscillating voltage signal (illustrated by a square wave signal 5 in FIG. 1) which oscillates at a high frequency, for example of the order to 10 to 15 KHz, between a voltage V1 and 0v, the voltage V1 being substantially equal to the voltage on the line 1.

A further insulated gate field effect transistor T3 is connected between, the gate g1 of the power MOSFET T1 and the ground line 2 so as, as is known in the art, to act as a pull-down transistor for enabling switching off of the power MOSFET T1. A gate signal for the pull-down IGFET T3 is supplied via logic circuitry (not shown) to an input connection P.

The operation of the circuit shown in FIG. 1 will now be briefly described.

Thus, when the voltage at the input connection I goes low, the capacitors C1 and C2 are charged from the positive supply line 1 via their respective diodes D1 and D2 until the capacitors C1 and C2 are at the voltage of the positive supply terminal 1. When the voltage at the input connection I goes high, the diodes D1 and D2 become reverse-biassed and so prevent discharging of the capacitors C1 and C2 via the diodes D1 and D2. Rather the charge stored by capacitor C2 is shared with the capacitor formed by the insulated gate g2 of the IGFET T2, thus raising the voltage of the insulated gate electrode g2 above the threshold voltage to render the IGFET T2 conducting. The charge stored by capacitor C1 can then flow via the drain electrode d2, conduction channel and source electrode S2 of the IGFET T2 to the insulated gate electrode g1 of the power MOSFET T1. The charge stored by capacitor C1 is thus shared with the capacitor formed by the insulated gate g1 of the power MOSFET T1. When capacitor C2 has discharged and the voltage on insulated gate g2 of the IGFET T2 has dropped below the threshold voltage, the above process is repeated for each cycle of the voltage signal supplied to the input connection I until after several such cycles the voltage at the insulated gate g1 of the power MOSFET T1 exceeds the voltage on the power supply line 1 by several volts (e.g. 5 v) to achieve hard turn-on of the power MOSFET T1, thus connecting the load via the conducting MOSFET T1 to the power supply line 1. As will be appreciated from the above, the capacitor formed by the insulated gate g1 of the power MOSFET T1 is prevented from discharging while the voltage signal at the input connection I is low by the IGFET T2 which ceases to conduct when the voltage at the input connection I goes low. The IGFET T2 thus acts as a synchronous rectifier. The maximum voltage above the voltage on the power supply line 1 to which the insulated gate g1 of the power MOSFET T1 may be raised will be determined by the reverse breakdown voltage of the diodes D1 and D2, which may be 12 volts.

The capacitance of the capacitor C1 should of course be larger than that of the capacitor C2 for efficient charge pumping and should be as large as practically possible bearing in mind any limitations on the dimensions of the capacitor plates. The capacitor C2 may have a capacitance of 3 pF and the capacitor C1 a capacitance of 30 pF.

As will be appreciated by those skilled in the art, when it is desired to turn off the power MOSFET T1, a signal is applied via the input connection P to render the IGFET T3 conducting so as to connect the gate g1 of the power MOSFET T1 to the ground line 2.

Referring now to FIG. 2, there is shown, in cross-section and part cut-away, a semiconductor device embodying the invention and suitable for use in the circuit described above with reference to FIG. 1.

The semiconductor device shown in FIG. 2 has a semiconductor body 6 carrying both the IGFET T2 and the power MOSFET T1.

As shown in FIG. 2, the IGFET T2 is a lateral device, that is the source and drain contacts are both situated at a given surface 6a of the semiconductor body so that current flows laterally through the IGFET T2 whereas the power MOSFET T1 is a vertical device, that is a device in which the source and drain contacts are on opposite surfaces of the semiconductor body 6 so that current flow is in a vertical direction through the semiconductor body. Such a vertical power MOSFET is normally made up of many hundreds of parallel-connected MOSFET cells having a common drain region and it should be appreciated that in the interests of simplicity FIG. 2 shows only a small part of the power MOSFET T1.

The semiconductor device shown in FIG. 2 comprises a semiconductor body 6 of one conductivity type (n-type in this example where the minus sign indicates relatively low doping). The semiconductor body 6 comprises an epitaxial layer or first region 7 on a highly doped n-type substrate 7a.

Referring now to the right hand side of FIG. 2, the IGFET T2 comprises a second region 8 of the opposite conductivity type (p type in the example) which meets the given surface 6a of the semiconductor body 6 and which provides a well which forms a pn junction 9 with the substrate 7 so as to isolate the IGFET T2 from the substrate 7 for reasons which will be explained hereinafter.

The second region 8 comprises an outer or first subsidiary region 8a which is annular when viewed in plan and defines the periphery of the well and a second or central subsidiary region 10. It should be understood that, as used herein, the term 'annular' includes, for example, annuli of circular, elliptical, rectangular or other polygonal shapes, the shape of the outer subsidiary region 8a when viewed in plan looking down onto the given surface 6a being determined by the desired geometry of the device.

The first subsidiary region 8a is a relatively shallow region 8a and a more highly doped relatively deep region 8b is disposed adjoining and around the relatively shallow region 8a to form with the first subsidiary region 8a a body region.

The central or second subsidiary region 10 which extends between and adjoins the inner periphery 8a' of the first subsidiary region 8a is sufficiently lowly doped and sufficiently thin so that the second region 10 becomes fully depleted of free charge carriers in operation of the IGFET T2 before a reverse-biassing voltage across the pn junction 9 reaches the breakdown voltage of the pn junction 9. The second subsidiary region 10 thus acts to spread the depletion region of the reverse-biassed pn junction 9 laterally (i.e. along the surface 6a) and so reduces the electric field at the given surface 6a, thereby increasing the breakdown voltage of the pn junction 9. Such a region is known as a RESURF (REduced SURface Field) region and is described in detail in, for example, a paper entitled "High Voltage Thin Layer Devices (RESURF Devices)" by J. A. Appels et al published in Philips Journal of Research Vol 35 No 1 1980 at pages 1 to 13. As indicated in the aforementioned paper, in order to function as a RESURF region, the product Nd of the thickness (or depth) d in cm and the doping concentration N in atoms cm$^{-3}$ of the region should be approximately $2 \times 10^{12}$ atoms cm$^{-2}$.

A source region 11 of the one conductivity type (n+ type in this example, where the plus sign indicates relatively high doping) is provided within and forms a pn junction 11a with the body region 8a, 8b adjacent the given surface 6a. As shown in FIG. 2, the source region 11 lies within the relatively shallow first subsidiary region 8a of the body region. A drain region 12 of the one conductivity type (n+ type in this example) is similarly provided adjacent the given surface in the RESURF or central region 10 so as to be spaced apart from the source region 11. In this example, the source region 11 is annular and surrounds the drain region 12.

A lowly doped region 13 of the one conductivity type adjacent the given surface 6a provides an extension of the drain region 12 towards the source region 11. The lowly doped drain extension region 13 forms a further RESURF region which enables the IGFET T2 to withstand not only a high voltage between the drain region 12 and the substrate 7 but also a high voltage between the source and drain regions 11 and 12. As shown in FIG. 2, the drain region 12 lies wholly within the RESURF region 13 and the RESURF region 13 forms a pn junction 13a with the RESURF region 10.

An insulated gate 14 overlies a first area 31a of the given surface 6a so that the underlying relatively shallow first subsidiary region 8a provides a conduction channel area 15 which, under control of a signal applied to the insulated gate 14 provides a gateable connection between the source and drain regions 11 and 12. The insulated gate 14 comprises a relatively thin insulating layer 16 of, for example, silicon dioxide and an overlying electrically conductive gate layer 17 of, for example doped polycrystalline silicon. The conductive gate layer 17 may however be a metal layer or a metal silicide layer or a composite of two or more of the aforementioned layers.

As shown in FIG. 2, the conductive gate layer 17 is stepped up over a relatively thick insulating layer 16a to provide a field plate 17a which, together with the drain RESURF region 13 acts to help the IGFET T2 withstand high voltages between the source region 11 and drain region 12 and between the drain region 12 and the substrate 7.

A further insulating layer 18 of silicon dioxide extends over the conductive gate layer 17.

Windows are opened in the insulating layer and metallization, for example aluminum, deposited to provide contacts for the drain, source, insulated gate and further electrodes d2, g2 and bg of the IGFET T2. Thus, the metallization provides contacts 19 and 21 to the source and drain regions 11 and 12, respectively, a contact (not shown) to the conductive gate layer and a contact 22 to the relatively deep relatively highly doped region 8b of the body region 8 to provide the further electrode bg for biassing the conduction channel area 15 and providing a conductive path for reverse-biassing the integral zener diode D3 provided between the source and body regions 11 and 8. As shown in FIG. 2, the more highly doped region 8b is extended on the left hand side of the IGFET T2 to enable provision of the contact 22.

The left hand side of FIG. 2 illustrates part of the power MOSFET T1. As indicated above, the power MOSFET T1 consists of many hundreds of parallel-connected IGFET cells sharing a common drain region which in this case is provided by the epitaxial layer 7 and substrate 7a.

Each cell of the power MOSFET T1 comprises a body region 58 of the one conductivity type formed within the substrate 7 of the semiconductor body 6. The body region 58 has a relatively deep relatively highly doped region 58b and a surrounding relatively shallow region 58a. A source region 511 of the one conductivity type (n type in this example) is provided within the body region 58 adjacent the given surface so as to extend across the region 58b into the relatively shallow region 58a. An insulated gate structure provided on the given surface defines an insulated gate 514 overlying parts of the body regions 58 to define conduction channel areas 515 of the power MOSFET. In contrast to the IGFET T2, in the power MOSFET T1 the relatively thin insulating layer 16 extends between adjacent cells and the conductive gate layer 17 similarly extends between adjacent cells. The IGFET cells may be arranged in any suitable pattern. Thus, if the regions 58 when viewed in plan, by a square or rectangular (with rounded off corners) outline then the cells may be arranged in a square or rectangular matrix whereas if the regions are hexagonal in outline, the cells may be arranged in a hexagonal closely-packed array.

Windows are opened in the insulating layer allowing the deposition of metallization to provide source metallization 519 and gate metallization (not shown). Although not shown in FIG. 2, the further electrode contact 22 connects with the source metallization 519. A drain contact 20 for the power MOSFET T1 is provided by depositing metallization, for example aluminum, on a surface 6b of the semiconductor body opposite the given surface.

In operation of the circuit shown in FIG. 1, the voltage drop across the source and drain electrodes of the power MOSFET T1 is low, less than one volt, and the fact that the further electrode contact 22 connects with the source contact 519 means that the voltage drop across the pn junction between the body region 8a, 8b of the IGFET T2 and the substrate 7 or drain region of the power MOSFET T1 is of the same order and moreover reverse-biasses the pn junction 9, preventing conduction to the substrate which could have occurred if the body region 8a, 8b had been shorted to the source region 11 in the conventional way.

Although not shown in FIG. 2, the source region 11 of the IGFET T2 is connected to the insulated gate 514 of the power MOSFET T1 for example by part of the metallization pattern or by an external connecting wire.

A method of manufacturing the semiconductor device shown in FIG. 2 will now be described, by way of example.

An n-type monocrystalline silicon epitaxial layer 7 having a resistivity of, typically 1 to 5 ohm cm is provided on a monocrystalline silicon substrate 4a. After cleaning to remove surface contaminants and to grow a protective layer of thermal silicon dioxide, p-type impurities are locally implanted into the semiconductor body 6 via the given surface 6a using an appropriate mask and are caused to diffuse partially into the semiconductor body 6 to provide two p-type regions which, after subsequent processing, will form the relatively deep regions 8b and 58b. In this example, the p-type impurity used is boron with an implementation energy of 45 KeV and a dose of $5 \times 10^{14}$ atoms cm$^{-2}$ and the impurities are partially driven into the semiconductor body by heating the semiconductor body to a temperature of approximately 900 degrees Celsius in an inert atmosphere.

P-type impurities are then locally implanted into the semiconductor body via the given surface 6a using an appropriate mask and subsequently n-type impurities are implanted through an appropriate subsequent mask to form regions which after subsequent processing will provide respectively the central RESURF region 10 and the drain extension RESURF region 13 of the IGFET T2. In this example the p-type impurity used is boron with an implantation energy of 170 KeV and a dose of from $2 \times 10^{12}$ to $10 \times 10^{12}$ atoms cm$^{-2}$ while the n-type impurity is arsenic with an implantation energy of 170 KeV and a dose of from $1 \times 10^{12}$ to $5 \times 10^{12}$ atoms cm$^{-2}$.

The introduced impurities are then caused to diffuse into the semiconductor body by he semiconductor body. The heating is carried out in an oxidizing atmosphere so that, simultaneously with the diffusion, a relatively thick layer of silicon dioxide is grown on the given surface 6a. In this particular example, the semiconductor body is heated to 1100 degrees Celsius in an oxidizing atmosphere for 255 minutes to produce a relatively thick layer field oxide layer of approximately 0.8 micrometers (8000 Angstroms) thickness. The heat treatment in the oxidizing atmosphere may comprise a first heating step in a dry oxygen atmosphere and a subsequent wet oxidizing step in a wet oxygen atmosphere.

The relative duration of the dry and wet oxidizing steps do not significantly affect the drive in of the impurities to form the relatively deep region 8b and 58b and, by adjusting the dose of impurities introduced to produce the RESURF regions 10 and 13 and the relative durations of the wet and dry oxidation steps, the desired thickness of relatively thick or field oxide can be grown without detrimentally affecting the desired profile for the RESURF regions 10 and 13. For example, for a boron dose of $8 \times 10^{12}$ atoms cm$^{-2}$ and an arsenic dose of $3 \times 10^{12}$ atoms cm$^{-2}$, the dry oxidizing step may last about 140 minutes and the wet oxidising step 105 minutes.

The field oxide or relatively thick insulating layer is then patterned or defined using a conventional photolithographic and etching technique to define the relatively thick insulating layer 16a. A relatively thin insulating layer 16 of gate oxide is then grown on the given surface 6a.

Polycrystalline silicon is then deposited on the insulating layer 16, 16a providing the conductive layer 17, 17a and the polycrystalline silicon layer then patterned or defined using conventional photolithographic and etching techniques to provide the insulated gate structures 14 and 514 shown in FIG. 2.

Using the insulated gate structure 14 and 514 as a mask p-type impurities, in this example boron, are implanted into the semiconductor body 6 to provide the relatively shallow regions 8a and 58a.

It is then necessary to open a window in the relatively thick insulating layers 16a to enable introduction of the impurities to produce the drain region 12 of the IGFET T2. This may be achieved, after protecting the insulated gate structure 514 of the power MOSFET T1, by first opening a window in the polycrystalline silicon layer 17a and then using a reactive ion etching technique to etch through the relatively thick insulating layer 16a.

Having opened the window, a mask is provided on the given surface to protect those areas of the body regions 8 and 58 where the source regions are not required and n-type impurities, in this example arsenic with an implantation energy of 80 KeV and a dose of $4 \times 10^{15}$ atoms cm$^{-2}$, are implanted into the given surface using the insulated gate structure 14 and 514 as a mask to produce the source regions 11 and 511 and drain region 12.

The further insulating layer 18, in this example of silicon dioxide, is then deposited onto the given surface 6a. Windows are then opened in the insulating layer and metallization, for example aluminum, deposited to form the source, drain, gate (not shown) and further electrode contacts 19, 20 and 22 of the IGFET T2 and the source 519 and gate (not shown) metallization of the power MOSFET metallization 20 is also deposited on the surface 3b. As mentioned above, metallization or an external contact (not shown) connects the source region 11 of the IGFET T2 to the insulated gate 514 of the power MOSFET T1. The source contact metallization 519 extends outwardly over the insulating layer 18 beyond the outer periphery of the body region 58 to provide a field plate 19a. The gate polycrystalline silicon layer 517 may similarly extend outwardly beyond the outer periphery up onto relatively thick insulating material 16a to provide a field plate 517a so providing a double field plate structure for the power MOSFET T1.

Although not shown, the lateral IGFET T2 may have a similar field plate structure to the power MOSFET T1 and, of course, any suitable alternative edge termination system may be used.

FIG. 3 illustrates a modified version of the semiconductor device shown in FIG. 2, similar or identical features having similar or identical reference numerals.

The semiconductor device shown in FIG. 3 differs from that shown in FIG. 2 in that the IGFET T2 is merged with the periphery of the power MOSFET T1 so that the relatively deep relatively highly doped region 58b of a cell at the periphery of the power MOSFET T1 merges with the relatively deep relatively highly doped region 8b of the IGFET T2. In this arrangement, the shorting of the source metallization 519 to the body region 58 provides the further electrode contact bg so that no separate connection is required. The power MOSFET structure may surround the IGFET T2, or as indicated in FIG. 3, the IGFET T2 may be provided at the periphery of the power MOSFET structure in which case the part of the IGFET T2 remote from the power MOSFET T1 will be similar to the arrangement shown in FIG. 2.

The semiconductor device shown in FIG. 3 may be manufactured in a similar way to that described above for the semiconductor device shown in FIG. 2, with appropriate mask modification.

The capacitors C1 and C2 and diodes D1 and D2 may be integrated in or on the same semiconductor body using conventional techniques. Alternatively, in the FIG. 2 arrangement the IGFET T2 and power MOSFET T1 any the other components may be provided as discrete components.

One or more further semiconductor components may be manufactured in or on the semiconductor body. Thus, for example, one or more high voltage semiconductor components may be provided in the same semiconductor body as may one or more low voltage logic type semiconductor components, enabling the production of a so-called intelligent power switch, that is a semiconductor device in which logic circuitry for controlling operation of a high power semiconductor device in incorporated in or on the semiconductor body for use in controlling power supply to a load such as a vehicle light, electric motor etc. under the control of logic signals from a central control circuit. For example a simple bus system and such intelligent power switches may be used to replace the traditional loom used for distributing power in motor vehicles. The present invention may however find application in fields other than or in addition to use in intelligent power switches.

The conductivity types of the various regions mentioned above could of course be reversed and the semiconductor body may comprise a semiconductor other the silicon. Furthermore, the power semiconductor switch could be any type of MOS-gated power device.

From reading the present disclosure, other modifications will be apparent to persons skilled in the art. Such modifications may involve other features which are already known in the design and manufacture of semiconductor devices and which may be used instead of or in addition to features already described herein.

We claim:

1. A semiconductor power switching device comprising an IGFET and a power semiconductor switch, which semiconductor device comprises a semiconductor body in which the IGFET and power semiconductor switch are formed, the semiconductor body having a first region of one conductivity type adjacent a given surface of the semiconductor body, the first region forming at least part of a conductive path to a first main electrode of the power switch, a second region of the opposite conductivity type provided within the first region adjacent the given surface and so as to form with the first region a first pn junction meeting the given surface, and third and fourth regions of the one conductivity type provided adjacent the given surface within the second region such that the third and fourth regions each form with the second region a pn junction meeting the given surface, an insulted gate provided above the given surface for defining a conduction channel providing a gate-controlled connection between the third and fourth regions which form the source and drain regions of the IGFET, a zener diode provided between the second region and the source region of the IGFET, and conductive means provided to the second region remote from the insulated gate for reverse biassing said zener diode so as to inhibit conduction from the second region to the first region.

2. A semiconductor device according to claim 1, wherein the drain region of the IGFET has an extension region which extends adjacent the given surface towards the source region and is sufficiently lowly doped and sufficiently thin so as during operation to become fully depleted of free charge carriers before the reverse breakdown voltage of the pn junction between the drain region and the second region is reached.

3. A semiconductor device according to claim 1 or 2, wherein the source and drain regions of the IGFET are formed, respectively, in first and second subsidiary regions of the second region.

4. A semiconductor device according to claim 3, wherein the second subsidiary region is sufficiently lowly doped and sufficiently thin so as during operation to become fully depleted of free charge carriers before the reverse breakdown voltage of the first pn junction.

5. A semiconductor device according to claim 3, wherein the power semiconductor switch comprises a fifth region of the opposite conductivity type adjacent the given surface within the first region, a sixth region of the one conductivity type within the fifth region forming with the fifth region a pn junction meeting a surface of the semiconductor body and a further insulated gate provided on the given surface to define a conduction channel providing a gate-controlled connection between the sixth region and the first region.

6. A semiconductor device according to claim 5, wherein the fifth region comprises a first relatively shallow subsidiary region and a relatively deep relatively highly doped further subsidiary region extending through the first relatively shallow subsidiary region of the fifth region, the sixth region lying within the first relatively shallow subsidiary region and separating the further subsidiary region from the further insulated gate.

7. A semiconductor device according to claim 3, wherein the first subsidiary region of the second region comprises a relatively shallow region having a relatively deep relatively highly doped further subsidiary region extending through the relatively shallow region, the source region of the IGFET lying within the relatively shallow region of the first subsidiary region of the second region and separating the further subsidiary region of the second region from the area of the second region underlying the insulated gate, the conductive path adjoining the further subsidiary region of the second region.

8. A semiconductor device according to claim 5, wherein the fifth region adjoins the first subsidiary region of the second region and the conductive path provided to the second region comprises a conductive region shorting the sixth region to the fifth region.

9. A semiconductor device according to claim 1, wherein the conductive path provided to the second region comprises a conductive electrode contacting only the second region.

10. A semiconductor power switching device comprising an IGFET and a power semiconductor switch having first and second main electrodes and a control electrode, which semiconductor device comprises a semiconductor body in which the IGFET and power semiconductor switch are formed, the semiconductor body having a first region of one conductivity type adjacent a given surface of the semiconductor body, the first region forming at least part of a conductive path to said first main electrode of the power switch, a second region of the opposite conductivity type provided within the first region adjacent the given surface and so as to form with the first region a first pn junction meeting the given surface, and third and fourth regions of the one conductivity type provided adjacent the given surface within the second region such that the third and fourth regions each form with the second region a pn junction meeting the given surface, an insulated gate provided above the given surface for defining a conduction channel providing a gate-controlled connection between the third and fourth regions which form the source and drain regions of the IGFET, a zener diode provided between the second region and the source region of the IGFET, a conductive path provided between the second main electrode of the power switch and the second region remote from the insulated gate for reverse-biassing said zener diode so as to inhibit conduction from the second region to the first region, and a further conductive path provided between the source region of the IGFET and the control electrode of the power switch for connecting the zener diode across the second main and control electrodes of the power semiconductor switch to protect the control electrode of the power semiconductor switch.

11. A semiconductor power switching device comprising an IGFET and a power semiconductor switch, which semiconductor device comprises a semiconductor body having a first region of one conductivity type adjacent a given surface of the semiconductor, the IGFET comprising a second region of the opposite conductivity type provided within the first region adjacent the given surface and forming with the first region a first pn junction meeting the given surface, and third and fourth regions of the one conductivity type provided adjacent the given surface within the second region such that the third and fourth regions each form with the second region a pn junction meeting the given surface, an insulated gate provided above the given surface for defining a conduction channel providing a gate-controlled connection between the third and fourth regions which form the source and drain regions of the IGFET, the power semiconductor switch comprising a fifth region of the opposite conductivity type adjacent the given surface within the first region, a sixth region of the one conductivity type within the fifth region forming with the fifth region a pn junction meeting a surface of the semiconductor body, and a further insulated gate provided on the given surface to define a conduction channel providing a gate-controlled connection between the sixth region and the first region which forms at least part of a conductive path to a first main electrode of the power switch, a zener diode being provided between the second region and the source region of the IGFET with a first conductive path being provided between the sixth region and the second region remote from the insulated gate for reverse-biassing said zener diode so as to inhibit conduction from the second region to the first region, and a further conductive path being provided between the source region of the IGFET and the further insulated gate for connecting the zener diode between the fifth region and the further insulated gate to protection the further insulated gate of the power semiconductor surface.

* * * * *